United States Patent [19]

Hallman et al.

[11] 3,762,325

[45] Oct. 2, 1973

[54] ELECTROMAGNETIC RADIATION SENSITIVE LITHOGRAPHIC PLATES

[75] Inventors: Robert W. Hallman, Utica; Gary W. Kurtz, Royal Oak, both of Mich.

[73] Assignee: Teeg Research, Inc., Detroit, Mich.

[22] Filed: May 11, 1970

[21] Appl. No.: 36,453

Related U.S. Application Data

[63] Continuation of Ser. No. 756,709, Aug. 1, 1968, abandoned, which is a continuation-in-part of Ser. No. 685,923, Nov. 27, 1967, abandoned.

[52] U.S. Cl. .......................... 101/453, 96/33, 96/36, 96/88, 101/456, 101/460, 101/450

[51] Int. Cl. .......................... B41n 1/00, B41n 3/00

[58] Field of Search .................. 96/33, 88; 101/453, 101/460, 456

[56] References Cited

UNITED STATES PATENTS 3,422,759 1/1969 Brynko et al. .......................... 96/33 X

*Primary Examiner*—David Klein

*Attorney*—Hauke, Gifford and Patalidis

[57] ABSTRACT

Electromagnetic radiation sensitive elements made of a layer of electromagnetic radiation sensitive material disposed on a support backing or substrate. The electromagnetic radiation sensitive material comprises essentially a substrate provided with a coating of a mixture or compound of inorganic elements which, after selective and discrete exposure to electromagnetic actinic radiation, is provided with selective and discrete surface area portions having chemical and physical characteristics substantially modified as a result of exposure to such electromagnetic radiation. The radiation sensitive elements of the invention have particular usefulness as resist materials and for making lithographic plates, photomasks, letterpress plates and diverse articles fabricated by photoresist processes and the like.

3 Claims, 4 Drawing Figures

ELECTROMAGNETIC RADIATION SENSITIVE LITHOGRAPHIC PLATES

CROSS REFERENCE TO RELATED APPLICATIONS

The present application is a continuation of application Ser. No. 756,709, filed Aug. 1, 1968, and now abandoned, is a continuation-in-part of application Ser. No. 685,923, filed Nov. 27, 1967, and now abandoned, and it is related to copending application Ser. No. 839,038, filed July 3, 1969, now U.S. Pat. No. 3,637,381 which in turn is a continuation-in-part of application Ser. No. 673,410, filed Oct. 6, 1967, and now abandoned.

BACKGROUND OF THE INVENTION

In co-pending application Ser. No. 839,038 there are disclosed radiation sensitive elements typically consisting of a metallic layer coated with a layer of material capable of interreacting with the metal or metals of the metallic layer when exposed to incident electromagnetic actinic radiation such as, for example, ordinary light. As a result of selective and discrete exposure to electromagnetic radiation in intensity and duration sufficient to cause an interreaction of the two layers at the irradiated areas, there is selectively and discretely caused the formation of an interreaction product having chemical and physical characteristics different from the non-irradiated portion areas of the element. Such radiation sensitive elements have particular usefulness for making lithographic offset plates and the like, without any further processing of the element after exposure, as a result of the differences in hydrophilic and oleophilic qualities of the exposed portions of the elements as compared to the unexposed portions thereof. Alternately, after exposure, a simple washing of the element in an appropriate solvent can result in another form of lithographic plate or provide a resist pattern for subsequent pattern-forming operations to make other types of lithographic plates or other articles.

The present invention results from the discovery that some of the materials disclosed in the aforesaid application as being capable of reacting with a metallic layer under the influence of electromagnetic radiation are endowed with the ability, after selective exposure to electromagnetic actinic radiation, to display physical and chemical characteristics different from those of the same materials having not been subjected to exposure to electromagnetic actinic radiation, even though a reactive metallic layer is absent. Such changes in chemical and physical qualities result, for example, in the hydrophilicity to oleophilicity ratio of the exposed areas being different from the hydrophilicity to oleophilicity ratio of the unexposed areas. In addition the exposed and unexposed areas exhibit differences in solubility in particular solvents which permit to obtain substantial increase in the differences between the hydrophilicity to oleophilicity ratios of the exposed and unexposed areas, and which further provide additional applications of the radiation sensitive elements of the invention such as application for example utilizing a very effective simple photoresist coating for the fabrication of finished articles by chemical etching techniques. Further differences in physical and chemical properties resulting from exposure include photo conductivity, reflectivity, transmissivity and absorptivity, electrical resistivity, density, and chemical reactivity.

The several objects and the many advantages of the present invention will become apparent to those skilled in the art when the accompanying description of some examples of the best modes contemplates for practicing the invention is read in conjunction with the accompanying drawings wherein like reference numerals refer to like or equivalent parts and in which:

DETAILED DESCRIPTION OF THE PREFERRED EMBODIMENTS

Figure 1:
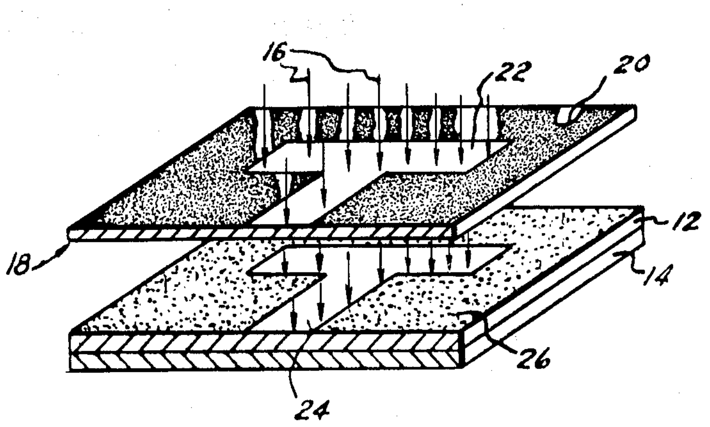
FIG. 1 is a schematic representation, partly in perspective and partly in section, of a radiation sensitive element according to the present invention in the process of being selectively and discretely exposed to electromagnetic radiation.

Referring to the drawings, and more particularly to FIG. 1 thereof, there is shown schematically, partly in perspective view, and partly in section, a typical radiation sensitive element 10 comprising a radiation sensitive layer 12 disposed in adhesion upon a substrate or support backing 14. The support backing or substrate may be any convenient material forming a layer, for example, of a few thousandths of an inch in thickness or thicker, shaped in any convenient way such as having a planar, curved shaped, or any other shape. The material of support backing or substrate 14 may be paper or cardboard, a plastic, or a metallic foil made of a metal such as zinc, aluminum, or the like which exhibits low reactivity or no reactivity at all with the material of the layer 12. It may be found desirable, for some applications, to provide an intermediate layer, not shown, between the layer 12 and the substrate 14, made for example of resin, lacquer, plastic, gold, silica glass and the like, for example, for preventing spontaneous or radiation induced interreaction between the layer 12 and the substrate 14 when the materials forming such layers are capable of interreacting. The material of the radiation sensitive layer 12 consists preferably of an inorganic compound or mixture, examples of which comprise: metal sulfides, such as arsenic sulfides, antimony sulfides, cadmium sulfides, bismuth sulfides, chromium sulfides, metal halides such as lead iodide, copper chloride, mercury chloride, metal selenides such as arsenic selenide, arsenic-sulfur compounds and mixtures, arsenic-sulfur-halogen compounds and mixtures, such halogen being preferably iodine, chloride or bromine, and arsenic-sulfur-antimony oxide mixtures. It will be appreciated that it has been discovered that compounds need not be prepared in precise stoichiometric proportions and that many of the compounds or mixtures are prepared in a glassy form. It will also be appreciated that additional elements may be introduced into the mixtures and compounds disclosed in order to modify certain characteristics, such additional elements being for example iodine, bromine, and silver.

Some of the preferred radiation sensitive inorganic materials comprise, for example, arsenic sulfides such as arsenic trisulfide and arsenic pentasulfide which are sensitive to exposure to electromagnetic actinic radiation, including visible light, and which have many advantages with respect to low cost, ease of manufacturing, long shelf life and substantial mechanical strength permitting handling without taking any unusual precautions.

The radiation sensitive material forms an adhering layer or coating 12 of a few angstroms in thickness to a few mils which is applied upon the substrate or support backing 14 by any one of several appropriate methods such as by vaporization and condensation upon the substrate or support backing 14 preferably under reduced atmosphere or by radpidly quenching the vapors under non-oxidizing conditions. Sputtering, ion plating and the like are also useful application techniques. The rapid quench is a very important aspect of the above types of preparation and it has been found desirable in some cases to provide for cooling of the substrate or heat or radiation shielding of the substrate in order to create a preferred degree of photosensitivity. An alternate method of applying the radiation sensitive layer 12 upon the substrate 14 is by preparing a solution of the radiation sensitive mixture or compound in an appropriate solvent or in an appropriate liquid suspension vehicle such as an aqueous solution of potassium carbonate, ammonium hydroxide, glycerine or water, and by painting or spraying a surface of the support backing or substrate with the solution or liquid vehicle, optionally followed by evaporation of the solvent or liquid vehicle, thus leaving on the surface on the support backing or substrate a thin coating of the electromagnetic radiation sensitive material.

A further typical example of preparation of a radiation sensitive element consists in making an arsenic-sulfur-iodine mixture rich in iodine to provide fluidity, coating the substrate by spraying, brushing or dipping, and evaporating the majority of the iodine so as to form a hard arsenic-sulfur rich coating on the substrate.

Alternatively, the radiation sensitive inorganic material may be in the form of a fine powder which is applied to the surface of the substrate for example simply by rubbing the surface with such powder.

In order to increase adhesion between the radiation sensitive layer 12 and the substrate 14, an appropriate interface layer, not shown, consisting of a varnish, lacquer, cement or the like may be disposed upon the surface of the substrate 14 prior to coating with the sensitive inorganic material layer 12, such interface layer further preventing interreaction between the inorganic material of the layer 12 and the substrate 14 if their respective materials are prone to interreact, as previously mentioned.

The sensitivity to actinic radiation of a predetermined inorganic material used for forming the layer 12 may be enhanced by heat-treatment of the material, such as by heating of the prepared radiation sensitive element followed by a rapid quench consisting in rapidly cooling the heated element. Where the alternate methods of preparing the radiation sensitive element by evaporation of the radiation sensitive material and condensation of the vapors on the substrate, as previously mentioned, the evaporation-condensation process is performed such as to rapidly cool the condensed material as it condenses upon the substrate. Such rapid cooling of the condensed material, or quenching of the material prepared by other methods, seems to be a very important step to produce a useful degree of photosensitivity for the majority of the disclosed inorganic materials, used in the preparation of radiation sensitive elements according to the present invention. In some cases it is critical that the temperature of the deposit does not exceed 200°C, and preferably be held as close to 25°C as possible, or lower.

The radiation sensitive material forming the layer 12 obtained by vapor deposition is "monolithic," that is in the form of a homogeneous non-particulate massive compound or mixture of constant composition and structure throughout the mass of the material, and the material is grainless as opposed to conventional photosensitive materials.

When coating of the substrate is effected by spraying or brushing of the substrate with a solution or liquid vehicle containing the sensitive material or by applying to the substrate surface a fine powder of the material, according to the alternate methods herein described, the resulting radiation sensitive coating is of course formed of a multitude of juxtaposed very fine grains which have been found to be generally less than a micron in size. However, it will be appreciated that contrary to conventional photographic emulsions the grain is not functional in terms of photographic speed. The radiation sensitive materials of the present invention do not depend upon the existence of such separate grains of sensitive material for achieving the purpose of exhibiting changes in physical and chemical characteristics as a result of exposure to electromagnetic radiation.

Electromagnetic radiation sensitive elements made according to the present invention have almost unlimited shelf life, and when it is desired to use an element for the purpose indicated, it is selectively and discretely exposed to electromagnetic actinic radiation 16, such as, by way of example but not limitation, light radiation, or the like, impinging as shown in FIG. 1 upon the surface of the electromagnetic radiation reactive layer 12 through an appropriate mask, as shown at 18, or alternately, by having an appropriate electromagnetic actinic radiation image projected upon the surface of the radiation sensitive layer 12 by any appropriate conventional image projection means. In the example illustrated, mask 18 has portions, as shown at 20, which are substantially non-transmissive of the electromagnetic actinic radiation 16, while other portions, as shown at 22, are substantially transmissive of such radiation. Consequently, discrete areas, as shown at 22, of the surface of the radiation sensitive layer 12 are irradiated by the electromagnetic actinic radiation 16, while other areas, as shown at 26, are substantially shielded from the action of the electromagnetic radiation.

Figure 2:
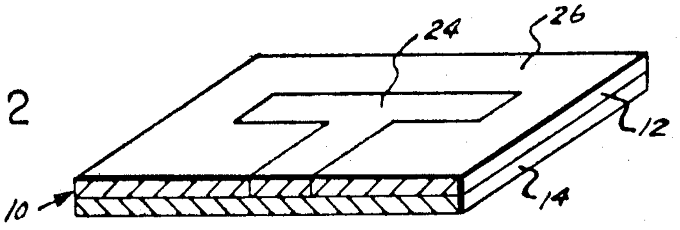
FIG. 2 is a view similar to FIG. 1, but showing the radiation sensitive element after selective and discrete exposure to electromagnetic radiation.

As a result of such selective and discrete irradiation of the electromagnetic radiation sensitive element 10 there is caused the formation of an image, which with some materials is a visible image, and which is represented by the surface areas 24 in FIGS. 1 and 2 having chemical and physical characteristics different from the unexposed surface areas 26 of the sensitive layer 12. It has been found that with a thin layer 12 of, for example, arsenic trisulfide or arsenic pentasulfide, disposed on a non-reactive substrate or support backing 14, after discrete and selective exposure to electromagnetic actinic radiation such as intense white light and the like, the hydrophilicity of the exposed areas 24 of the sensitive layer 12 is increased relatively to that of the unexposed areas 26 to a considerable degree permitting the exposed radiation sensitive element to be effectively usable, after wetting and "inking," as a positive lithographic plate or cylinder, or the like, for offset printing. Such "inked" articles are, of course not limited to lithographic plates since the ink or other oleophilic substances with an additive which can be for example conductive, resistive, opaque or decorative, yield finished articles which are simple to make and of high utility. The use of inks which may be hardened to produce raised letters or contours permits to obtain letter press plates and relief decorative articles. With the layer 12 made of arsenic trisulfide, the unexposed areas 26 of the surface of the sensitive layer 12 are oleophilic, which in this case is not limited to specific greases or oils but includes any compound or mixture with a selectively controllable affinity for this surface to the point that during inking of the plate or cylinder, subsequently to wetting of the total surface of the plate or cylinder, such unexposed surface areas accept ink, while the exposed areas 24, being substantially hydrophilic, once wetted with water or most aqueous solutions, are caused to reject the ink.

Figure 3:
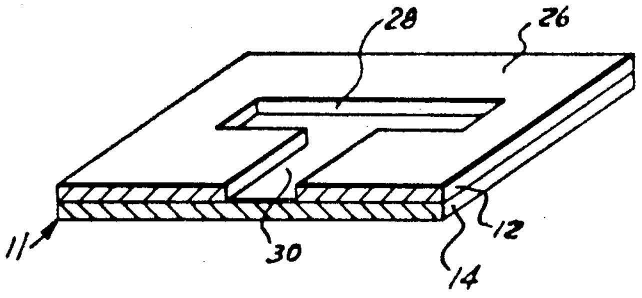
FIG. 3 is a view similar to FIG. 2, but showing the radiation sensitive element after having been subjected to the action of an appropriate solvent.

The exposed area portions 24 of the radiation sensitive element 10 also exhibit a difference in solubility in predetermined solvents as compared to the solubility in the same solvent of the unexposed area portions 26. For example, radiation sensitive elements having a layer 12 of arsenic trisulfide or arsenic pentasulfide exhibit a pronounced increase of solubility of the exposed surface area portions 24 in some mold aqueous solutions, such as mild aqueous solutions of ammonium hydroxide as compared to the unexposed surface area portions 26, such that under the action of such mild solutions of ammonium hydroxide or the like upon the exposed element 10 of FIG. 2, there is obtained a plate or element as shown at 11 in FIG. 3 presenting discontinuities of the layer 12, as shown at 28, which correspond to the surface areas of the layer 12 which have been previously exposed to electromagnetic actinic radiation and which physically expose corresponding surface areas 30 of the substrate or support backing 14. Other solvents which have been found suitable include sodium sulfide, ammonium hydroxide, potassium carbonate and certain commercial detergents.

Alternately, the exposed areas 24 may be caused to resist dissolution in solvents or solutions in which the unexposed areas 26 are relatively soluble by means of selective solvents such as lithium carbonate, or controlled concentrations of sodium triphosphate-polyphosphate combinations. This results in a negative lithographic plate or the like as compared to the positive plate obtained, as previously explained by ammonium hydroxide and the like. The selective solubility of exposed or unexposed areas is dependent on the nature of the solvent, its concentration and/or pH. A given solvent when prepared in concentrated form may be employed to selectively dissolve exposed areas, and in relatively dilute form the same solvent can be used to selectively dissolve unexposed areas. For example, a radiation sensitive element having a sensitive layer 12 of arsenic trisulfide can be processed into a positive lithographic plate by sponging the surface of the element or dipping it in a saturated sodium phosphate-carbonate solution at room temperature. By using the same sodium phosphate-carbonate solution at room temperature, but diluted to a 10 to 1 ratio, 10 parts water for one part of the solution, the same plate would be processed into a negative plate. However, if the diluted solution is heated to at least 35°–40°C, the plate would again be processed into a positive plate.

The advantages procured by the radiation sensitive elements of the invention consisting in being capable of being processed after exposure so as to provide a positive lithographic plate or alternately a negative plate according to the processing technique selected is a very important aspect of the present invention as it permits to utilize identical elements for accomplishing opposite results.

It will be appreciated that the sensitive layer may be used as a resist for photomask fabrication or in fact is useful as a masking element itself. In this case the sensitive layer 12 is disposed over a glass substrate 14 or the like and after discrete exposure selectively dissolved to form a masking element consisting of the exposed sensitive layer areas becoming non-transmissive to radiation and the dissolved areas physically exposing the substrate defining the transmissive areas. The advantages of such photomasks are numerous including high resolution, very sharp edge definition, simplicity of processing and in some cases transparency to radiation in the visible portion of the spectrum combined with high opacity to ultraviolet, permitting direct registration.

Figure 4:
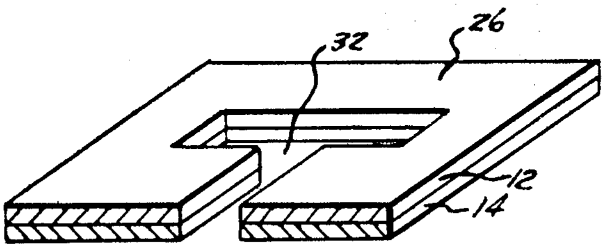
FIG. 4 is a view similar to FIG. 3, but showing the exposed radiation sensitive element after having been subjected to the action of a solvent capable of dissolving the material of the support backing or substrate therein.

In the example of radiation sensitive element having a sensitive layer 12 made of arsenic trisulfide or pentasulfide, after selective and discrete exposure to electromagnetic radiation and dissolution of the exposed areas in an appropriate solvent, it is obvious that if the material of the substrate or support backing 14 is selected such that its surface is hydrophilic, the unexposed areas 26 of the sensitive layer 12 are oleophilic, as compared to the exposed areas now removed by an appropriate solvent from the surface of the substrate or support backing, FIG. 3. It is also obvious that if the material of the substrate or support backing 14 is capable of dissolution in an appropriate solvent in which the remaining portions 26 corresponding to the unexposed areas of the sensitive layer 12 are substantially insoluble, the remaining portions 26 of the layer 12 act as a resist to the action of such solvent such that an article as shown in FIG. 4 is obtained which is provided with recessed areas corresponding to the areas originally exposed to electromagnetic radiation. Such recessed areas may be caused to extend in depth through the whole thickness of the support backing or substrate 14 so as to form shaped apertures as shown at 32 in FIG. 4, in a manner substantially alike chemical milling. The action of the solvent may be stopped at any time it is so desired to provide a controlled depth of the recessed areas. Such a technique is useful in the manufacture of, for example, letterpress plates, reticles, photoengravings and diverse mechanical parts.

It can thus be seen that the present invention provides for obtaining lithographic plates by simple and convenient means, and also provides for a resist material for the manufacture of a variety of articles by methods comparable to conventional "photo-resist" methods and greatly superior thereto with respect to quality, costs and simplicity of manufacturing.

It can further be seen that the present invention describes a new material discovery which teaches that inorganic materials are capable of performing as photoresists and photolithographic surfaces. The concepts herein described utilize exposure to intense electromagnetic actinic radiation which produces non-decaying changes in the chemical and physical properties of the radiation sensitive materials which may then be utilized in some cases without the necessity of auxiliary or subsequent treatments to produce finished articles.

Having thus described the invention by way of examples thereof given for illustrative purpose only, what is sought to be protected by United States Letters Patent is as follows:

1. A lithographic plate comprising a substantially inert substrate and an adhering layer of an inorganic material, wherein said inorganic material is selected from the group consisting of arsenic trisulfide and arsenic pentasulfide and has been modified as a result of selective and discrete exposure to electromagnetic actinic radiation so as to exhibit discrete exposed areas having permanent directly induced hydrophilicity and oleophilicty characteristics different from those of discrete unexposed areas.

2. A lithographic plate according to claim 1 wherein said inorganic material is arsenic trisulfide.

3. A lithographic plate according to claim 1 wherein said inorganic material is arsenic pentasulfide.

* * * * *